US009814152B2

(12) United States Patent
Nishida et al.

(10) Patent No.: US 9,814,152 B2
(45) Date of Patent: Nov. 7, 2017

(54) WATERPROOF CONTROL APPARATUS

(71) Applicants: Mitsubishi Electric Corporation, Tokyo (JP); YAZAKI CORPORATION, Tokyo (JP)

(72) Inventors: Mitsunori Nishida, Tokyo (JE); Osamu Nishizawa, Tokyo (JP); Wataru Tamura, Tokyo (JP); Keishi Jinno, Shizuoka (JP); Kouichi Ohyama, Shizuoka (JP)

(73) Assignees: Mitsubishi Electric Corporation, Chiyoda-ku, Tokyo (JP); YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/178,636

(22) Filed: Jun. 10, 2016

(65) Prior Publication Data
US 2017/0223854 A1  Aug. 3, 2017

(30) Foreign Application Priority Data
Feb. 1, 2016  (JP) ................................. 2016-016842

(51) Int. Cl.
  *H05K 5/06*  (2006.01)
  *H05K 5/00*  (2006.01)
  *H05K 5/02*  (2006.01)

(52) U.S. Cl.
  CPC ........... *H05K 5/069* (2013.01); *H05K 5/0026* (2013.01); *H05K 5/0217* (2013.01)

(58) Field of Classification Search
  CPC .... H05K 5/069; H05K 5/0217; H05K 5/0026; H05K 5/061; H05K 5/06; H05K 5/0056
  (Continued)

(56) References Cited

U.S. PATENT DOCUMENTS

2007/0134981 A1* 6/2007 Shinoda ............... H05K 5/0047
                                                    439/587
2008/0158823 A1* 7/2008 Tominaga ........... B60R 16/0239
                                                    361/709

(Continued)

FOREIGN PATENT DOCUMENTS

JP       10199608 A    7/1998
JP     2000-228243 A   8/2000
              (Continued)

OTHER PUBLICATIONS

Communication dated Nov. 29, 2016, issued by the Japan Patent Office in corresponding Japanese Application No. 2016-016842.

*Primary Examiner* — Steven T Sawyer
*Assistant Examiner* — Sagar Shrestha
(74) *Attorney, Agent, or Firm* — Sughrue Mion, PLLC; Richard C. Turner

(57) ABSTRACT

A case configured with a base and a cover watertightly contains a circuit board, and a connector housing having a diaphragm is mounted in the circuit board so that the inside and the outside of the case are electrically connected with each other; an outer ring-shaped circumferential wall is provided on the outer surface of the diaphragm, and a protrusion portion having first and second ventilation holes is provided at the side surface of the outer ring-shaped circumferential wall; one end of each of the first and second ventilation holes communicates with the outer surface portion of a water-repellent filter provided on the inner wall surface of the diaphragm, and the other end thereof communicates with the inside of a recess portion that is situated at a side of a mating connector and fits with the protrusion portion.

9 Claims, 10 Drawing Sheets

(58) Field of Classification Search
USPC .. 361/679.01, 728–730, 736, 748, 752, 796, 361/800, 816; 174/50.5, 50.51, 50.52, 174/359, 520; 439/76.1, 79, 587, 589, 439/936
See application file for complete search history.

(56) References Cited

U.S. PATENT DOCUMENTS

| | | | | |
|---|---|---|---|---|
| 2008/0158830 A1* | 7/2008 | Tominaga | ............... | H05K 3/32 361/722 |
| 2008/0278918 A1* | 11/2008 | Tominaga | ........... | B62D 5/0406 361/719 |
| 2010/0103632 A1* | 4/2010 | Kato | ...................... | H05K 5/006 361/752 |
| 2011/0211311 A1* | 9/2011 | Shinoda | ............... | H05K 5/0047 361/694 |
| 2012/0069532 A1* | 3/2012 | Azumi | ................. | H05K 5/0052 361/752 |
| 2013/0250521 A1* | 9/2013 | Kawai | ................ | H05K 7/20854 361/714 |
| 2014/0065877 A1* | 3/2014 | Ohhashi | ............... | H05K 5/0052 439/519 |
| 2015/0208525 A1* | 7/2015 | Negishi | ................ | H05K 5/0056 361/752 |
| 2015/0216088 A1* | 7/2015 | Kawai | ................... | H05K 1/0203 361/710 |
| 2015/0250072 A1* | 9/2015 | Ichikawa | ............... | H05K 5/063 439/587 |
| 2016/0295721 A1* | 10/2016 | Furudate | ............... | B60R 16/02 |

FOREIGN PATENT DOCUMENTS

| | | |
|---|---|---|
| JP | 200363325 A | 3/2003 |
| JP | 2011-165748 A | 8/2011 |

* cited by examiner

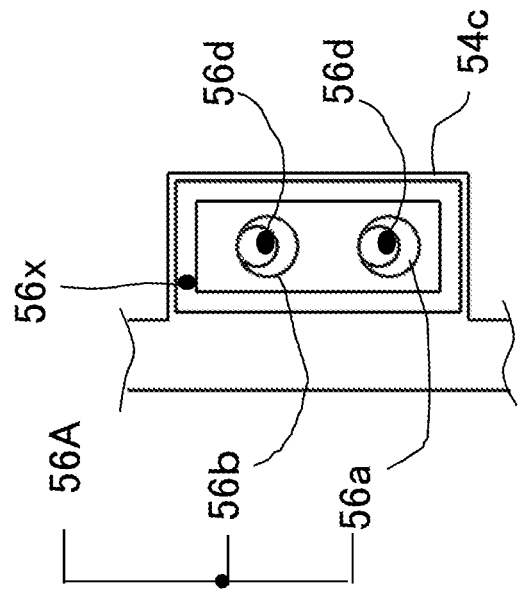
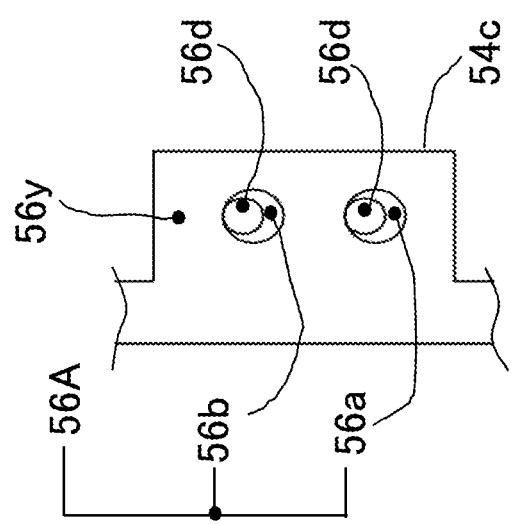
FIG. 5A
FIG. 5B

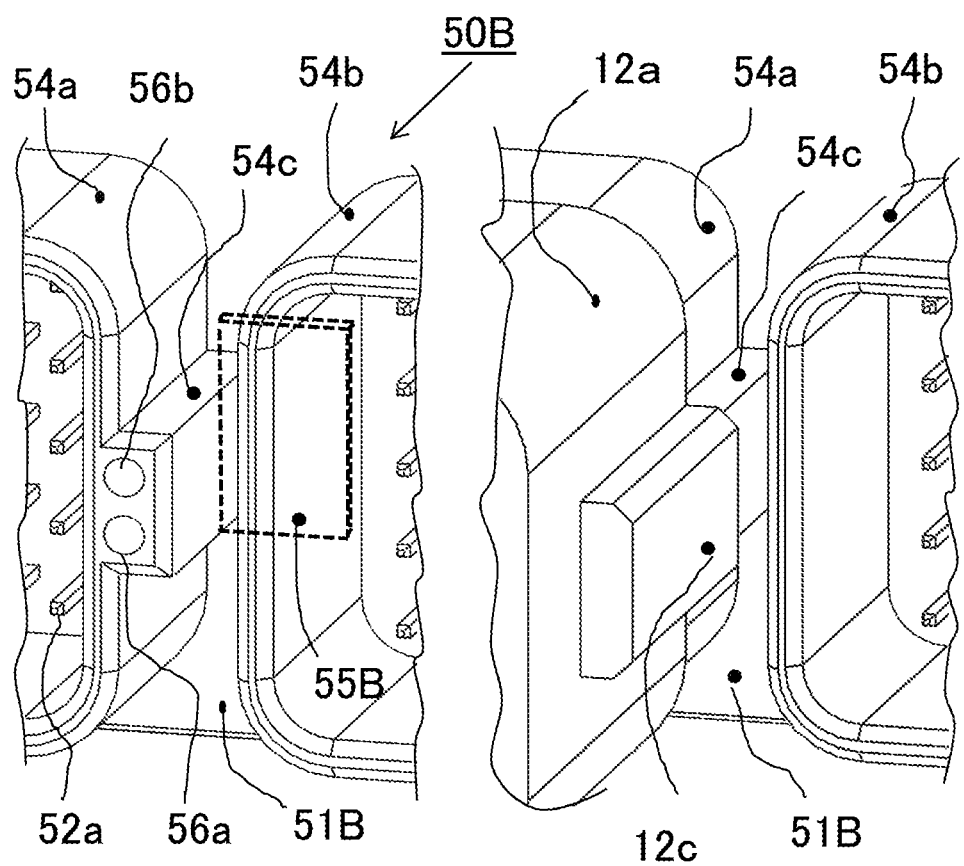

WATERPROOF CONTROL APPARATUS

BACKGROUND OF THE INVENTION

Field of the Invention

The present invention relates to a waterproof control apparatus, which is a vehicle electronic control apparatus to be provided, for example, in an engine room, and particularly to a waterproof control apparatus having a respiratory ventilation structure that protects a waterproof-seal structure by interposing a water-repellent filter between the outer air and a waterproof-watertight case including a heat-generating component.

Description of the Related Art

A waterproof control apparatus is known in which a circuit board is watertightly contained in a case configured with abase and a cover, in which circuit components including a heat-generating component and an external-wiring connector housing, part of which is exposed from the case, are mounted on the circuit board, and in which a waterproof sealing material is provided on the respective joint surfaces among the base, the cover, and the connector housing. In the waterproof control apparatus, in order to prevent an air-pressure difference between the respective air pressures in the inside and the outside of the case, which is caused by a temperature rise in the heat-generating component in the case, from deforming the structure of the case or damaging the watertight sealing structure thereof, a water-repellent filter is provided on the cover or the base so that air inside the case is exposed to the outer air. The water-repellent filter is formed of a flat porous material including a plurality of fine pores for preventing water drops from intruding into the case and for letting the air freely pass therethrough; a mounting structure has been contrived so that the porous material is not stained through direct water pouring.

A waterproof control apparatus including a water-repellent filter provided on the cover is one of the configurations that have been widely put into practice; however, because a cover is a part that is mostly liable to become subject to direct water pouring, there has been a problem that a ventilation structure that can withstand direct water pouring due to high-pressure washing or the like is required and the ventilation structure is complex and expensive. A waterproof control apparatus including a water-repellent filter provided on the back-side portion of a base is another configuration. In this case, the water-repellent filter is provided at a position that is not liable to become subject to direct water pouring due to high-pressure washing; however, there has been a problem that in the case where the base is formed of sheet metal or an aluminum die-cast, it is difficult to bond and fix the water-repellent filter itself to the back-side portion. In the case of a base formed of resin, the water-repellent filter can readily be fixed through thermal welding; however, there has been a problem that heat generated in the case cannot be radiated through heat transfer.

The periphery of the connector with which a wire harness is connected is the most favorable place where both the position that is not liable to become subject to direct water pouring and the peripheral structure are taken into consideration.

For example, in "Ventilation Structure of Waterproof Case" disclosed in Japanese Patent Application Laid-Open No. 2000-228243 (Patent Document 1), as is seen in FIG. 1 thereof, a plurality of ventilation holes 23 for communicating the inside of a connecter 20 for a wire harness 19 to the air is formed in the connecter 20, and a water-repellent filter 24 having both air permeability and a waterproof property is integrated with the ventilation hole 23 through welding or the like. One or more communication holes 25 for communicating the inside of the connector 20 for the wire harness 19 to the inside of a waterproof case 11 are formed in a connector 17 for a circuit board 16 contained in the waterproof case 11. The inside of the waterproof case 11 and the inside of the connector 20 are communicated to the air through the ventilation hole 23 and the communication hole 25, respectively, so that water absorption due to a negative pressure is prevented and hence both a short-circuit in the connector 20 and a short-circuit in the circuit board 16 are prevented.

In "Waterproof Case" disclosed in Japanese Patent Application Laid-Open No. 2011-165748 (Patent Document 2), as is seen in FIGS. 9 and 12 thereof, a ventilation hole 20 is provided in a cover 18 of a waterproof case 300 containing an electronic board 15, and a respiration filter 10 configured with a double-face adhesive member 11 and a filter main body 12 is disposed on the outer surface of the cover 18. A slanted ventilation groove 26 communicating with the respiration filter 10 is formed in the cover 18, and a shielding plate 24 seals the respiration filter 10 and the ventilation groove 26, excluding the front end opening portion of the ventilation groove 26.

As a result, the respiration filter is configured with a ventilation groove having a labyrinth structure and a sealing member; therefore, unlike a conventional technology, it is not required to provide a plurality of ventilation holes in the case or a respiration filter across any two sides of the case; thus, it is allegedly claimed that because the respiration filter can be downsized, the cost can be suppressed and that clogging in the respiration filter can be reduced. The reference numerals utilized in each of the foregoing explanations for Patent Documents 1 and 2 are the ones utilized in each of the Patent Documents 1 and 2.

[Patent Document 1] Japanese Patent Application Laid-Open No. 2000-228243 (paragraphs 0013 through 0016, and FIG. 1)

[Patent Document 2] Japanese Patent Application Laid-Open No. 2011-165748 (Paragraphs 0058 through 0063, FIGS. 8 through 12)

In "Ventilation Structure of Waterproof Case" disclosed in Patent Document 1, the water-repellent filter 24 is mounted on the connector 20 for the wire harness 19 and the respective insides of both the waterproof case 11 and the connector 20 are communicated to the air, so that water absorption is prevented from causing a short-circuit in the connector 20 and a short-circuit in the circuit board 16 . Accordingly, although provided at a place that is not liable to become subject to direct water pouring, the water-repellent filter 24 is disposed in a narrow space inside the connector 20; thus, there has been a problem that because the ventilation area is small, a difference between the pressure in the waterproof case 11 and the air pressure may be caused.

Moreover, because the waterproof control apparatus itself does not include any water-repellent filter, there has been a problem that the functional test of the apparatus alone cannot be performed.

In the case of "Waterproof Case" disclosed in Patent Document 2, the respiration filter (water-repellent filter) 10 having a labyrinth-structure ventilation hole is provided on the cover 18 at a position that is an immediate back side of the middle portion between the connector housings 17a and 17b; the to-the-air opening thereof is situated at the intermediate portion between the connector housings 17a and 17b. As a result, although the to-the-air opening is situated at a place that is not liable to become subject to direct water pouring, the cover 18 needs to have an opening wall face that abuts on the housings 17a and 17b and an inner wall face to which the respiration filter 10 is bonded and fixed and that has the ventilation hole 20; thus, there has been a problem that because the cover contour becomes complex, it is difficult to utilize the cover 18, as a sheet-metal cover, to say the least.

Moreover, depending on the direction in which the waterproof case is mounted, the to-the-air opening may become subject to direct water pouring, thus, there has been a problem that the waterproof case cannot be applied to that mounting angle.

SUMMARY OF THE INVENTION

The first objective of the present invention is to provide a waterproof control apparatus provided with a water-repellent filter mounting structure in which a water-repellent filter is mounted inside a waterproof control apparatus and that can prevent direct water pouring to a to-the-air opening without requiring any complex mounting structure.

The second objective of the present invention is to provide a waterproof control apparatus provided with a water-repellent filter mounting structure that can prevent direct water pouring in response to various mounting positions and mounting angles of a waterproof control apparatus in various applications.

A waterproof control apparatus according to the present invention includes a circuit board that is watertightly contained in a case configured with a cover and a base having a mounting face, a connector housing that is formed of a resin-molded material, mounted in the circuit board, and exposed from a side opening portion of the cover, and a plurality of first connection terminals mounted in a diaphragm of the connector housing; the waterproof control apparatus is characterized in that one terminal of the first connection terminal is connected with a circuit strip conductor on the circuit board, and the other terminal thereof abuts on and is connected with the second connection terminal provided in a mating connector so as to be connected with a wire harness provided at the outside of the case, in that the connector housing includes an outer ring-shaped circumferential wall that is provided at the outer side of the diaphragm and with which the mating connector fits, and a water-repellent filter that is formed of a porous material including a plurality of fine pores for preventing water drops from intruding into the case and for letting the air freely pass therethrough and that is watertightly fixed to the inner surface of the diaphragm, and the water-repellent filter includes an inner surface portion that communicates with the inner space of the case and an outer surface portion that communicates with a respiratory ventilation hole for introducing the outer air, in that the respiratory ventilation hole penetrates the inside of a protrusion portion provided in the external wall surface of the outer ring-shaped circumferential wall, and a waterproof packing for preventing water from intruding into a closed space including a conductive contact portion between the first connection terminal and the second connection terminal is provided between the end surface portion of the outer ring-shaped circumferential wall and the mating connector that fits with the outer ring-shaped circumferential wall, and in that at the external position of the closed space, the respiratory ventilation hole communicates with the folded ventilation surface that is opened to the air through part of or the whole of the inner surface of the circumferential wall of the mating connector.

In the waterproof control apparatus according to the present invention, because as the foregoing configuration, the water-repellent filter is mounted on the inner surface of the connector housing, there is demonstrated an effect that the function test of the apparatus itself can be performed and that in comparison with the method of providing the water-repellent filter in the mating connector, the area of the water-repellent filter is widened so that the difference between the inside pressure and the outside pressure can be reduced; moreover, there can be demonstrated an effect that in comparison with the method of providing the water-repellent filter on a dedicated middle wall of the cover, the mounting is simple and inexpensive so that the cover formed of resin or sheet metal can be utilized.

Furthermore, the outer surface portion 55b of the water-repellent filter is opened to the air through the respiratory ventilation hole and the inner wall surface, of the mating connector, that becomes a folded ventilation surface; thus, by utilizing the water-repellent filter, which is simply configured, and forming a respiratory ventilation path through molding structure of the connector housing, it is made possible to cope with the mounting environments in such a way that direct water pouring from the to-the-air opening is prevented; therefore, there is demonstrated an effect that regardless of which mounting method is utilized, the base and the cover, which are common, can be utilized.

The foregoing and other objects, features, aspects and advantages of the present invention will become more apparent from the following detailed description of the present invention when taken in conjunction with the accompanying drawings.

Figure 6:
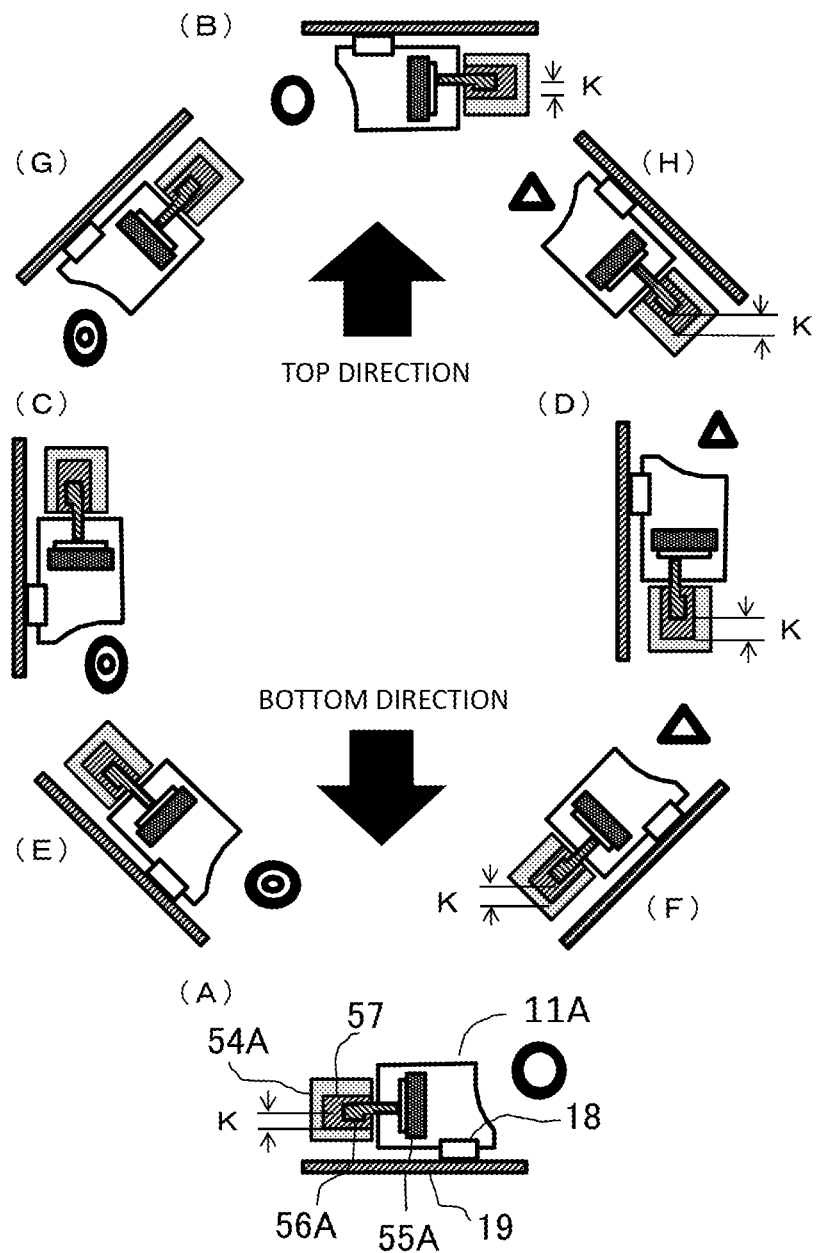
Figure 7:
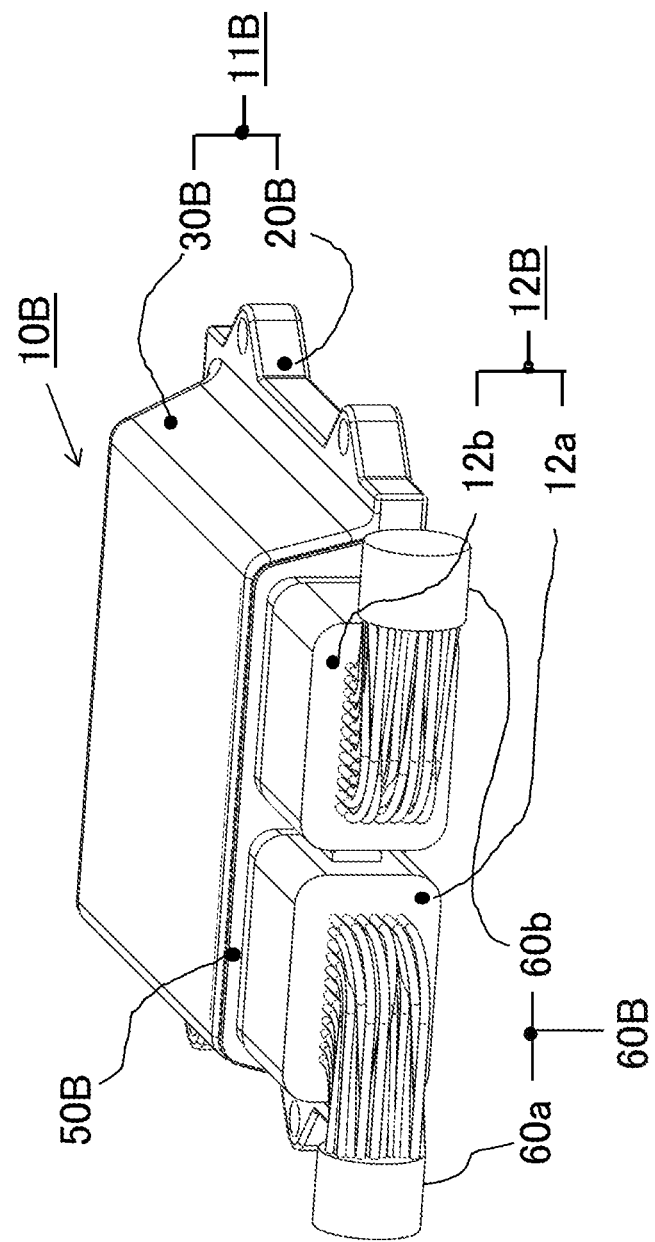
Figure 8:
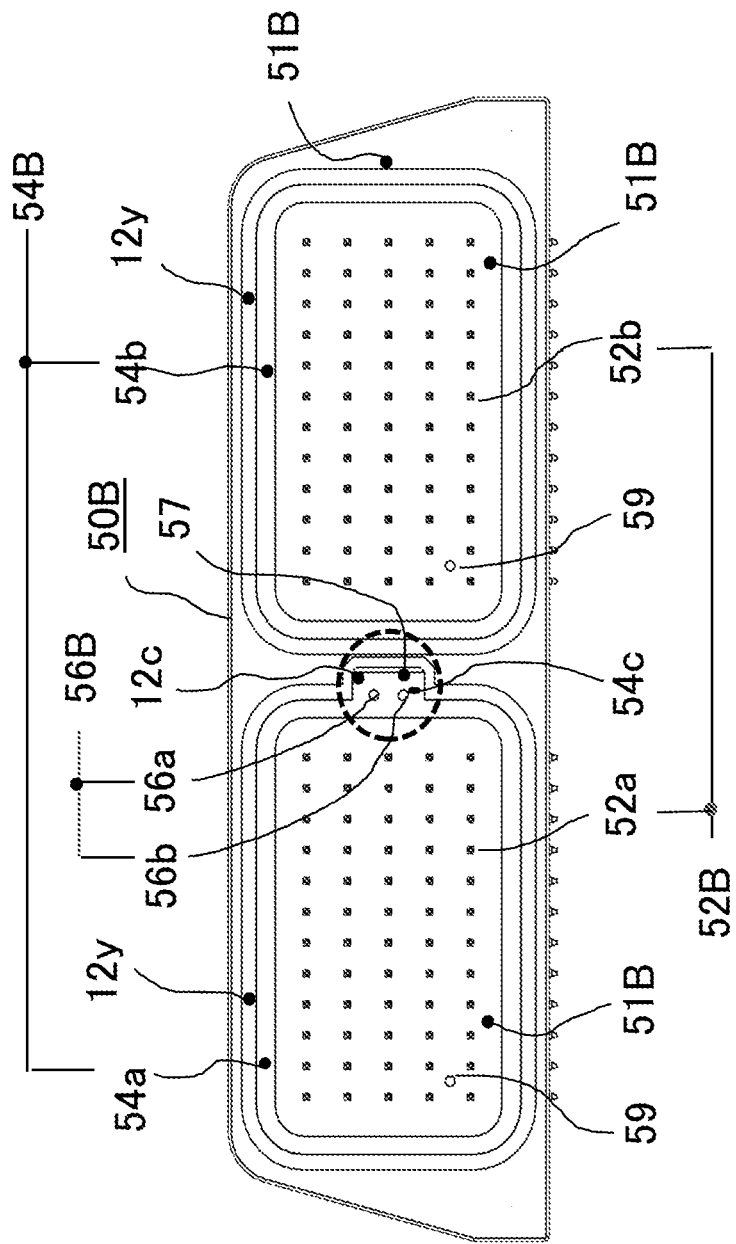
Figure 9:
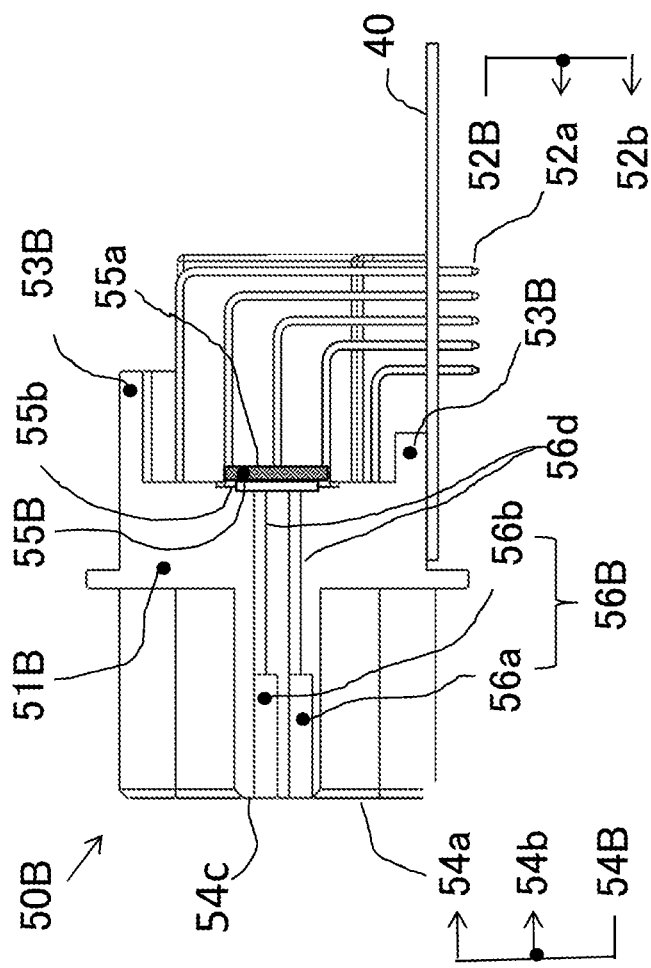

Each of FIGS. 5A and 5B is an end view of a respiratory ventilation hole in the waterproof control apparatus according to Embodiment 1 of the present invention;

FIG. 6 is an explanatory view illustrating the positions of a ventilation opening portion for various mounting angles of the waterproof control apparatus according to Embodiment 1;

FIG. 7 is an external view of a waterproof control apparatus according to Embodiment 2 of the present invention;

FIG. 8 is a front view of a connector connection portion of the waterproof control apparatus according to Embodiment 2 of the present invention;

FIG. 9 is a detailed cross-sectional view of a connector housing of the waterproof control apparatus according to Embodiment 2 of the present invention; and Each of FIGS. 10A and 10B is a detailed explanatory view of a folded ventilation path of the waterproof control apparatus according to Embodiment 2 of the present invention.

DETAILED DESCRIPTION OF THE PREFERRED EMBODIMENTS

Hereinafter, preferred embodiments of a waterproof control apparatus according to the present invention will be explained with reference to the drawings. The explanation will be made with reference to the drawings, in each of which the same or similar constituent members and elements are designated by the same reference numerals.

Embodiment 1

(1) Detailed Description of Configuration

Figure 1:
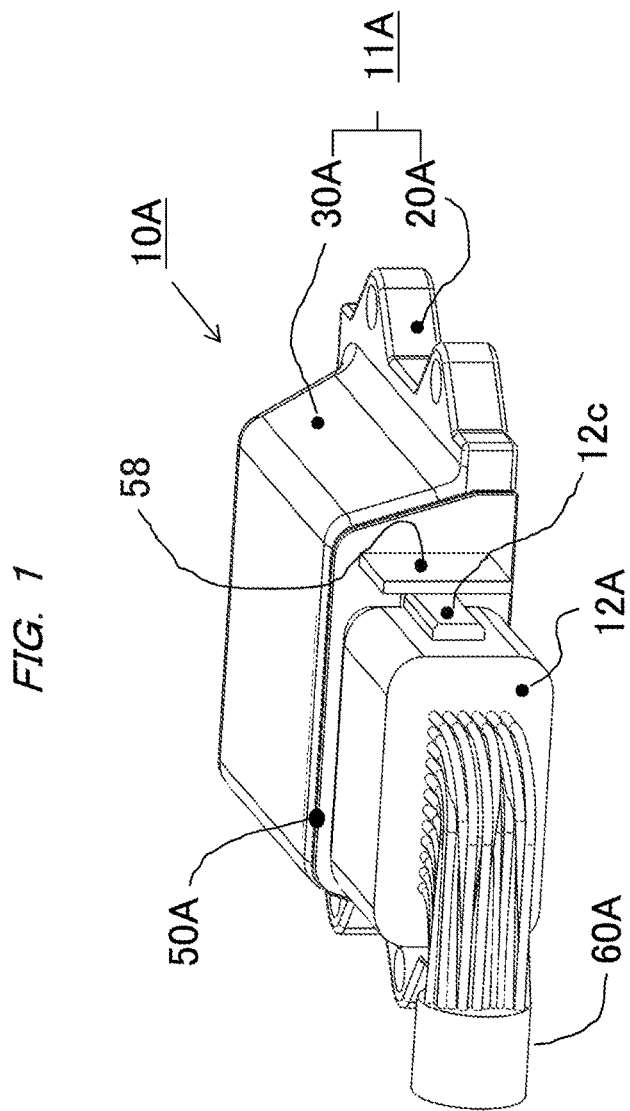
FIG. 1 is an external view of a waterproof control apparatus according to Embodiment 1 of the present invention.
Figure 2:
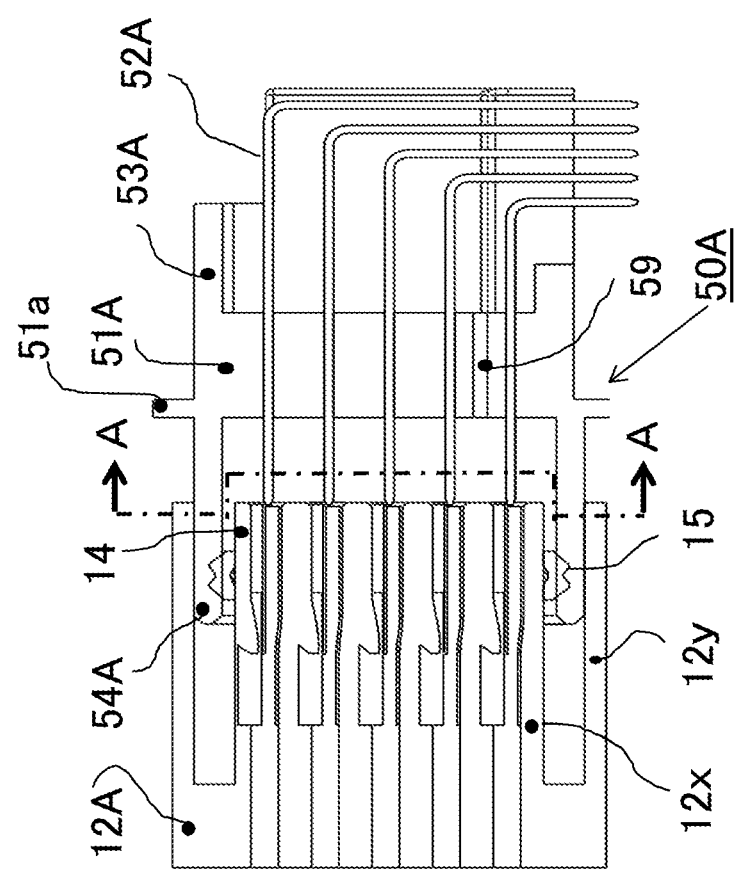
FIG. 2 is a cross-sectional view of the connector connection portion of the waterproof control apparatus according to Embodiment 1 of the present invention.
Figure 3:
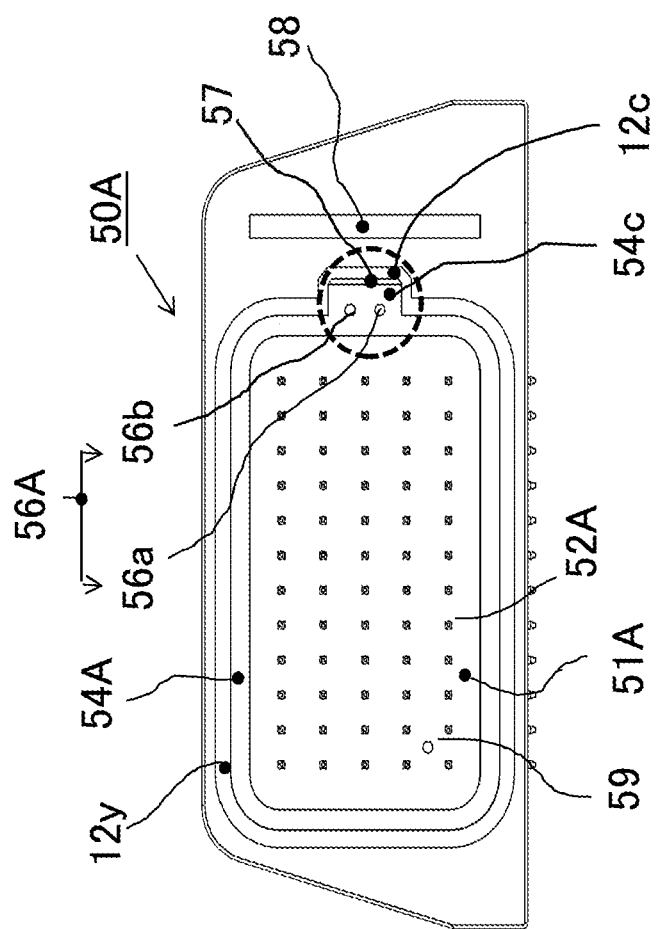
FIG. 3 is a cross-sectional view of the connector connection portion, taken along the A-A line in FIG. 2.
Figure 4:
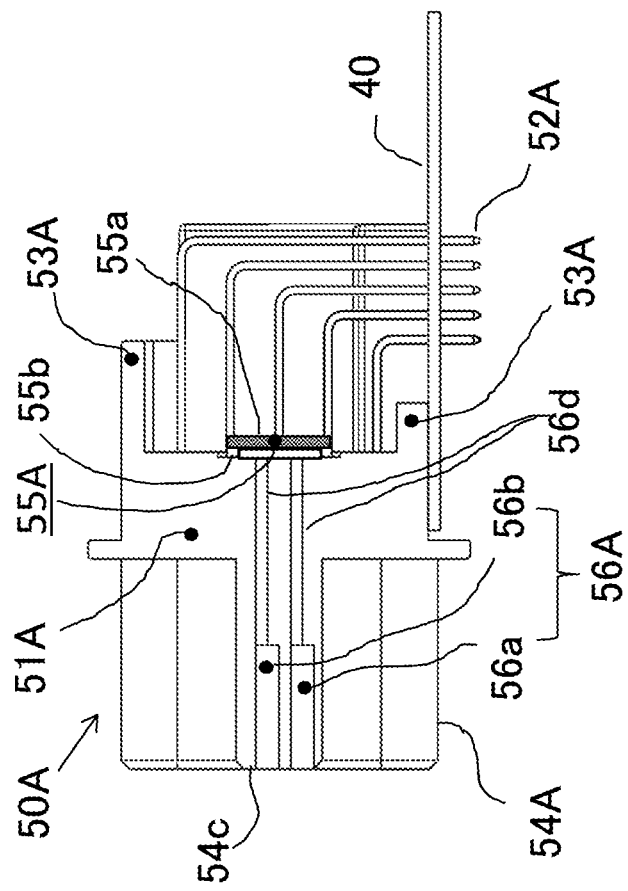
FIG. 4 is a detailed cross-sectional view of a connector housing of the waterproof control apparatus according to Embodiment 1 of the present invention.

Each of FIG. 1 through FIGS. 5A and 5B is a view for explaining a waterproof control apparatus according to Embodiment 1 of the present invention; FIG. 1 is an external view; FIG. 2 is a cross-sectional view of a connector connection portion; FIG. 3 is a cross-sectional view taken along the A-A line in FIG. 2; FIG. 4 is a detailed cross-sectional view of a connector housing; Each of FIGS. 5A and 5B illustrates an end view of a respiratory ventilation hole. The configuration thereof will sequentially be explained in detail.

In FIG. 1, which is an external view of a waterproof control apparatus 10A, a case 11A is configured with a cover 30A formed of resin or sheet metal and a base 20A, formed of an aluminum die-cast or sheet metal, that has mounting feet at four corners thereof. The case 11A watertightly contains a circuit board 40 on which a connector housing 50A, described later in FIG. 4, is mounted; a protruding water-shielding wall 58 is provided on the external wall surface of a diaphragm 51A of a connector housing 50A. The exposed portions of the connector housing 50A are inserted into a mating connector 12A and are connected with an external apparatus through the intermediary of a wire harness 60A. The external wall of a recess portion 12c, described later in FIG. 3, is provided in the side wall surface of the mating connector 12A.

In FIG. 2, which is a cross-sectional view of the connector portion, the connector housing 50A formed of resin has an outer ring-shaped circumferential wall 54A and an inner ring-shaped circumferential wall 53A that are provided on the left side and the right side, respectively, of the diaphragm 51A; the mating connector 12A is mounted on the outer ring-shaped circumferential wall 54A at a side, of the case 11A, that is exposed from the case 11A. A ring-shaped protrusion 51a situated in the middle between the outer ring-shaped circumferential wall 54A and the inner ring-shaped circumferential wall 53A abuts on the outer surface of the opening end of the case 11A through the intermediary of an unillustrated waterproof sealing material. The three outer circumferential sides of the inner ring-shaped circumferential wall 53A abut on the opening surface of the covert 30A, illustrated in FIG. 1, through the intermediary of an unillustrated waterproof sealing material; one remaining outer circumferential side thereof abuts on one side of the base 20A through the intermediary of an unillustrated waterproof sealing material. A plurality of first connection terminals 52A is fixed in the diaphragm 51A. One end of the first connection terminal 52A is bent approximately at a right angle and is soldered in the circuit board 40, described later in FIG. 4; the other end thereof makes conductive contact with a second connection terminal 14 provided in the mating connector 12A. A narrow hole 59 is provided in the diaphragm 51A and communicates the inner space of the case 11A to the fully-sealed space in the connector.

In the mating connector 12A, a ring-shaped space is formed of an inner body portion 12X into which a plurality of second connection terminals 14 is inserted and an outer circumferential wall 12y that encloses the inner body portion 12X; the outer ring-shaped circumferential wall 54A of the connector housing 50A is inserted into the ring-shaped space. An unillustrated waterproof mechanism is provided at the position where the mating connector 12A and the wire harness 60A illustrated in FIG. 1 are taken in; the gap between the mating connector 12A and the connector housing 50A is waterproofed by waterproof packing 15 disposed between the inner circumferential surface of the outer ring-shaped circumferential wall 54A and the outer circumference of the inner body portion 12X.

In FIG. 3, which is a cross-sectional view taken along the A-A line in FIG. 2, a plurality of first connection terminals 52A is mounted and the narrow hole 59, described above in FIG. 2, is provided in the diaphragm 51A. A protrusion portion 54c is provided in the sidewall of the outer ring-shaped circumferential wall 54A; in the protrusion portion 54c, a respiratory ventilation hole 56A including first and second ventilation holes 56a and 56b are opened and exposed. The recess portion 12c, which fits with the protrusion portion 54c, is provided in the outer circumferential wall 12y of the mating connector 12A, which fit with the outer circumference of the outer ring-shaped circumferential wall 54A. A folded ventilation path 57 is situated between the outer surface of the protrusion portion 54c and the inner surface of the recess portion 12c; the folded ventilation path 57 and the respiratory ventilation hole 56A communicate with each other. In FIG. 3, a fitting gap is formed between the inner wall of the outer circumferential wall 12y of the mating connector 12A and the outer wall of the outer ring-shaped circumferential wall 54A; the fitting gap also forms a folded ventilation surface, which is part of the folded ventilation path 57. The water-shielding wall 58 protrusively provided in the diaphragm 51A at the outside of the outer ring-shaped circumferential wall 54A prevents the opening end of the folded ventilation path 57 from becoming subject to direct pouring of high-pressure washing water.

In FIG. 4, which is a detailed cross-sectional view of the connector housing 50A, the connector housing 50A is fixed to one side of the circuit board 40 and a plurality of right-angle first connection terminals 52A is soldered in the circuit board 40. A water-repellent filter 55A that has an inner surface portion 55a and an outer surface portion 55b and is formed of a flat porous material in the shape of, for example, a circle, a rectangle, or an ellipse is fixed to the inner wall of the diaphragm 51A of the connector housing 50A to which the plurality of first connection terminals 52A is mounted and fixed. The inner surface portion 55a of the water-repellent filter 55A is fully opened to the inner space of the case 11A; the outer surface portion 55b is fully opened, except for the contour outer circumference thereof, to the respiratory ventilation hole 56A including the first and second ventilation holes 56a and 56b provided in the protrusion portion 54c of the outer ring-shaped circumferential wall 54A. Each of the first and second ventilation holes 56a and 56b has a large hole diameter at the opening end thereof; in the inner portion thereof communicating to the outer surface portion 55b of the water-repellent filter 55A, each of the first and second ventilation holes 56a and 56b becomes a throttle hole portion 56d.

In FIG. 5A, which is an end view of the respiratory ventilation hole 56A, the respiratory ventilation hole 56 including the first and second ventilation holes 56a and 56b is opened at the endface of the protrusion portion 54c of the outer ring-shaped circumferential wall 54A and communicates with the outer surface portion 55b of the water-repellent filter 55A through the inner throttle hole portion 56d; the opening endface is provided on a plateau plain portion 56y that is higher than its periphery. As illustrated in FIG. 5B, the opening endface of the respiratory ventilation hole 56A is provided inside a ring-shaped protruding surface 56x. Accordingly, the structure of a jig, which is utilized to open or close the respiratory ventilation hole 56A after the mating connector 12A is removed at a time when a ventilation test is performed, becomes simple; by adhering an elastic member such as rubber to the jig surface, the opening endface of the respiratory ventilation hole 56A can readily be sealed in an watertight manner. Any one of the first and second ventilation holes 56a and 56b may be eliminated; in addition, although in this example, arranged in the vertical direction, the first and second ventilation holes 56a and 56b may be arranged in the horizontal direction.

(2) Detailed Description of Operation and Action

Next, with regard to the waterproof control apparatus 10A, described with reference to FIG. 1, the mounting direction of the waterproof control apparatus 10A and whether or not there exists water pouring to the water-repellent filter 55A will be explained in detail, with reference to FIG. 6, which is an explanatory view illustrating the positions of a ventilation opening portion for various mounting angles. In FIG. 6, as illustrated in FIG. 5A, each of the throttle hole portions 56d of the respiratory ventilation hole 56A at the positions (A), (E), (C), and (G) is situated at the upper position in the first ventilation hole 56a or the second ventilation hole 56b; as illustrated in FIG. 5B, each of the throttle hole portions 56d of the respiratory ventilation hole 56A at the positions (B), (H), (D), and (F) is situated at the lower position in the first ventilation hole 56a or the second ventilation hole 56b.

At first, in FIGS. 1 and 4, an unillustrated heat-generating component is mounted in the circuit board 40 watertightly contained in the case 11A; when due to the difference between the temperature of the inside of the case 11A and the temperature of the outside of the case 11A, an air pressure difference occurs, respiration of air in the case 11A is performed through the water-repellent filter 55A and the respiratory ventilation hole 56A. This respiration prevents the case 11A from being deformed; in addition, this respiration prevents the waterproof sealing material between the base 20A and the cover 30A and the waterproof sealing material between the connector housing 50A and the base 20A or the cover 30A from being cracked or detached. The respiration of air in the connector space, containing the conductive contact portion between the first connection terminals 52A and the second connection terminal 14, that is watertightly sealed by the connector housing 50A and the mating connector 12A is performed through the narrow hole 59 (refer to FIG. 2), the space in the case 11A, and the respiratory ventilation hole 56A.

FIG. 6(A) is a simplified view at a time when the case 11A is mounted on a floor surface such as the top surface of a shelf plate. As illustrated in FIG. 6(A), the case 11A is fixed on a mounting plane 19, which is a horizontal floor surface, through the intermediary of a mounting foot 18. The folded ventilation path 57 is provided at the opening portion of the respiratory ventilation hole 56A that communicates, through the intermediary of the throttle hole portion 56d, with the water-repellent filter 55A contained in the case 11A; the folded ventilation path 57 is opened to the air at the external wall surface of the diaphragm 51A. Accordingly, the opening portion of the respiratory ventilation hole 56A does not become subject to direct water pouring due to high-pressure washing in the direction from the top side to the floor surface. Even when due to intrusion of a small amount of poured water through the to-the-air opening of the folded ventilation path 57, a puddle is temporarily caused in the folded ventilation path 57, no puddle intrudes into the respiratory ventilation hole 56A, as long as the dimension of the puddle is the same as or smaller than a critical dimension K between the bottom of the folded ventilation path 57 and the bottom of the throttle hole portion 56d; therefore, the water-repellent filter 55A is not subject to water pouring.

FIG. 6(B) is a simplified view at a time when the case 11A is mounted on a ceiling surface such as the undersurface of a shelf plate.

As illustrated in FIG. 6(B), splashing water, which splashes on the ceiling surface, may intrude into the to-the-air opening of the folded ventilation path 57 and reaches the water-repellent filter 55A; however, no puddle intrudes into the respiratory ventilation hole 56A, as long as the dimension of the puddle is the same as or smaller than the critical dimension K, described above with reference to FIG. 6(A); therefore, the water-repellent filter 55A is not subject to water pouring.

FIG. 6(C) is a simplified view at a time when the case 11A is mounted on a vertical wall surface. As illustrated in FIG. 6(C), because the connector is situated at the upper side, water poured to the wall surface does not intrude into the to-the-air opening of the folded ventilation path 57, which becomes an ascending hole; therefore, the water-repellent filter 55A is not subject to water pouring.

FIG. 6(D) is a simplified view at a time when the case 11A is mounted on a vertical wall surface. As illustrated in FIG. 6(D), because the connector is situated at the lower side, water poured to the wall surface intrudes into the to-the-air opening of the folded ventilation path 57; however, because the respiratory ventilation hole 56A becomes an ascending hole, the water-repellent filter 55A is not subject to water pouring. Moreover, when the dimension of a puddle in the folded ventilation path 57 is the same as or smaller than the critical dimension K, no puddle is sucked up by a negative pressure in the case 11A and then the puddle is dried and evaporates in due course of time.

FIG. 6(E) is a simplified view at a time when the case 11A is mounted on an inclined floor surface in such a way that the connector is situated at the upper side. As illustrated in FIG. 6(E), as is the case with FIG. 6(C), poured water does not intrude into the to-the-air opening of the folded ventilation path 57, which faces to the top side; therefore, the water-repellent filter 55A is not subject to water pouring.

FIG. 6(F) is a simplified view at a time when the case 11A is mounted on an inclined floor surface in such a way that the connector is situated at the lower side. As illustrated in FIG. 6(F), poured water intrudes through the to-the-air opening of the folded ventilation path 57, as is the case with FIG. 6(D); however, because the respiratory ventilation hole 56A becomes an ascending hole, the water-repellent filter 55A is not subject to water pouring. When the dimension of a puddle in the folded ventilation path 57 is the same as or smaller than the critical dimension K, no puddle is sucked up by a negative pressure in the case 11A and then the puddle is dried and evaporates in due course of time.

FIG. 6(G) is a simplified view at a time when the case 11A is mounted on an inclined ceiling surface in such a way that the connector is situated at the upper side. As illustrated in FIG. 6(G), as is the case with FIG. 6(C), poured water does not intrude into the to-the-air opening of the folded ventilation path 57, which becomes an ascending hole; therefore, the water-repellent filter 55A is not subject to water pouring.

FIG. 6(H) is a simplified view at a time when the case 11A is mounted on an inclined ceiling surface in such a way that the connector is situated at the lower side. As illustrated in FIG. 6(H), poured water intrudes through the to-the-air opening of the folded ventilation path 57, as is the case with FIG. 6(D); however, because the respiratory ventilation hole 56A becomes an ascending hole, the water-repellent filter 55A is not subject to water pouring. When the dimension of a puddle in the folded ventilation path 57 is the same as or smaller than the critical dimension K, no puddle is sucked up by a negative pressure in the case 11A and then the puddle is dried and evaporates in due course of time.

In each of the wall surface mounting methods in FIGS. 6(C) and 6(D), the connector housing 50A is mounted in the direction toward the upper ceiling surface side or the lower floor surface side of the case 11A; provided the connector housing 50A is mounted in the horizontal direction, the respiratory ventilation hole 56A is horizontally situated; thus, when poured water intrudes also into the folded ventilation path 57, there may be a risk that the water-repellent filter 55A becomes subject to water pouring. However, even in this case, by keeping the top surface of a puddle under the bottom surface of the throttle hole portion 56d, the puddle can be prevented from intruding into the throttle hole portion 56d.

(3) Gist and Feature of Embodiment 1

As is clear from the foregoing explanation, in the waterproof control apparatus 10A according to Embodiment 1, the case 11A configured with the cover 30A and the base 20A having a mounting face watertightly contains the circuit board 40; there are provided the connector housing 50A that is mounted at one side of the circuit board 40 and is formed of a resin-molded member exposed from the side opening portion of the cover 30A and the plurality of first connection terminals 52A mounted in the diaphragm 51A of the connector housing 50A; one terminal of the first connection terminal 52A is connected with a circuit strip conductor on the circuit board 40, and the other terminal thereof abuts on and is connected with the second connection terminal 14 provided in the mating connector 12A so as to be connected with the wire harness 60A provided at the outside of the case 11A; the connector housing 50A is provided at the outer side of the diaphragm 51A and includes the outer ring-shaped circumferential wall 54A with which the mating connector 12A fits; the water-repellent filter 55A, which is a flat porous material including a plurality of fine pores for preventing water drops from intruding into the case 11A and for letting the air freely pass therethrough, is watertightly fixed to the inner surface of the diaphragm 51A; the water-repellent filter 55A includes the inner surface portion 55a that communicates with the inner space of the case 11A and the outer surface portion 55b that communicates with the respiratory ventilation hole 56A for introducing the outer air.

The respiratory ventilation hole 56A penetrates the inside of the protrusion portion 54c provided in the external wall surface of the outer ring-shaped circumferential wall 54A; the waterproof packing 15 for preventing water from intruding into the closed space including the conductive contact portion between the first connection terminal 52A and the second connection terminal 14 is provided between the end surface portion of the outer ring-shaped circumferential wall 54A and the mating connector 12A that fits with the outer ring-shaped circumferential wall 54A; at the external position of the foregoing closed space, the respiratory ventilation hole 56A communicates with the folded ventilation surface that is opened to the air through part of or the whole of the inner surface of the circumferential wall of the mating connector 12A.

Therefore, because the water-repellent filter 55A is mounted on the inner surface of the connector housing 50A, the function test of the apparatus itself can be performed, and hence there can be demonstrated an effect that in comparison with the method of providing the water-repellent filter 55A in the mating connector 12A, the area of the water-repellent filter 55A is widened so that the difference between the inside pressure and the outside pressure can be reduced.

Moreover, there can be demonstrated an effect that in comparison with the method of providing the water-repellent filter 55A on a dedicated middle wall of the cover 30A, the mounting is simple and inexpensive so that the cover 30A formed of resin or sheet metal can be utilized.

Furthermore, the outer surface portion 55b of the water-repellent filter 55A is opened to the air through the respiratory ventilation hole 56A and the inner wall surface, of the mating connector 12A, that becomes a folded ventilation surface; thus, by utilizing the water-repellent filter 55A, which is simply configured, and forming a respiratory ventilation path through molding structure of the connector housing 50A, it is made possible to cope with the mounting environments so that direct water pouring from the to-the-air opening is prevented; therefore, there is demonstrated an effect that regardless of which mounting method is utilized, the base 20A and the cover 30A, which are common, can be utilized.

Related to claim 2 of the present invention, the recess portion 12c that fits with the protrusion portion 54c is provided in the inner wall surface of the mating connector 12A; the folded ventilation path 57 that communicates with the respiratory ventilation hole 56A is formed between the outer wall of the protrusion portion 54c and the inner wall 25 of the recess portion 12c; at a position that is close to the diaphragm 51A, one end of the folded ventilation path 57 is opened to the air.

As described above, the folded ventilation path 57 communicating to the respiratory ventilation hole 56A is provided in the fitting surface between the mating connector 12A and the outer ring-shaped circumferential wall 54A; as a result, there is demonstrated a characteristic that the respiratory ventilation hole 56A and the folded ventilation path 57 included in a two-way ventilation path can obtain a long folding dimension with which a fitting introduction member is provided at a time when the mating connector 12A fits therewith and that the area of the opening end of the mating connector 12A is prevented from being totally exposed to the air so that the possibility of water intrusion can be reduced. Embodiment 2, described later, demonstrates the same characteristic.

Related to claim 3 of the present invention, the water-shielding wall 58 is integrally provided at the side position of the outer ring-shaped circumferential wall 54A; the water-shielding wall 58 is provided at a position of the to-the-air opening that is close to the respiratory ventilation hole 56A.

As described above, in order to prevent direct water pouring to the to-the-air opening in the vicinity of the respiratory ventilation hole 56A, the water-shielding wall 58 is provided at the side of the outer ring-shaped circumferential wall 54A; as a result, there is demonstrated a characteristic that even when the case 11A is mounted under the environment where the case 11A is liable to become subject to direct water pouring, the direct water pouring to the water-repellent filter 55A can be prevented with an inexpensive configuration.

Related to claim 5 of the present invention, the two or more first connection terminals 52A are arranged at positions in two or more upper/lower stairs in a direction that are perpendicular to the board surface of the circuit board 40; the respiratory ventilation hole 56A includes the first ventilation hole 56a and the second ventilation hole 56b that are arranged in the vertical direction or in the horizontal direction that is perpendicular to the board surface of the circuit board 40; one end of each of the first and second ventilation holes 56*a* and 56*b* communicates with the outer surface portion 55*b* of the water-repellent filter 55A, and the other end of each of the first and second ventilation holes 56*a* and 56*b* is opened to the air through the inner wall surface of the mating connector 12A or the folded ventilation path 57.

As described above, the first and second ventilation holes 56*a* and 56*b* that communicate to the outer surface portion 55*b* of the water-repellent filter 55A are provided in the vertical or horizontal row, and the first and second ventilation holes 56*a* and 56*b* are opened to the air through the inner wall surface of the mating connector 12A or the folded ventilation path 57. Accordingly, there is demonstrated a characteristic that even when clogging occurs in one ventilation hole, ventilation can be performed by the other ventilation hole and hence the reliability is raised. Embodiment 2, described later, demonstrates the same characteristic.

Related to claim 6 of the present invention, the throttle hole portion 56*d* is provided so that the hole diameter of the respiratory ventilation hole 56A becomes smaller at an approaching position that communicates with the outer surface portion 55*b* of the water-repellent filter 55A. Accordingly, even when due to a small gradient of the mounting face of the waterproof control apparatus 10A, the respiratory ventilation hole 56A is slightly inclined from the horizon and hence the water-repellent filter 55A is situated lower than the respiratory ventilation hole 56A, a puddle of intruding poured water is formed so that the water is prevented from intruding into the water-repellent filter 55A. When due to a large gradient of the mounting face of the waterproof control apparatus 10A, the throttle hole portion 56*d* is situated lower than the water-repellent filter 55A, the folded ventilation surface or the folded ventilation path 57 becomes an ascending path; therefore, no puddle is produced in the folded ventilation surface or the folded ventilation path 57; thus, no poured water intrudes into the respiratory ventilation hole 56A. When the throttle hole portion 56*d* is situated upper than the water-repellent filter 55A, the diaphragm 51A of the connector housing 50A becomes a ceiling surface so that high-pressure washing water is not directly poured to the to-the-air opening; because even when there exist a small amount of splashing water, the respiratory ventilation hole 56A becomes an ascending hole and because a gap is provided between the opening surface of the respiratory ventilation hole 56A and a puddle in the folded ventilation surface or the folded ventilation path 57 so that no sucking by a negative pressure occurs, water pouring to the water-repellent filter 55A can be prevented. The puddle in the folded ventilation surface or the folded ventilation path 57 is dried and evaporates in due course of time. Embodiment 2, described later, demonstrates the same characteristic.

Related to claim 7 of the present invention, the throttle hole portion 56*d* is unevenly distributed with respect to the center position of the respiratory ventilation hole 56A; when the mounting inclination angle is known, the contour of a nesting die for producing the throttle hole portion 56*d* is modified so that the throttle hole portion 56*d* is unevenly distributed in such a way that a poured-water puddle becomes wider.

As described above, the center position of the throttle hole portion 56*d* provided at the front end portion of the respiratory ventilation hole 56A is disposed in such a way as to be shifted in accordance with the mounting inclination angle of the base 20A. Therefore, there is demonstrated a characteristic that it is not required to modify the die for the mating connector 12A and that the amount of a powered-water puddle in the respiratory ventilation hole 56A can be increased in accordance with the mounting inclination angle of the base 20A. Embodiment 2, described later, demonstrates the same characteristic.

Related to claim 8 of the present invention, the narrow hole 59 that communicates with the inner space of the case 11A is provided in the inner surface of the outer ring-shaped circumferential wall 54A. Therefore, there is demonstrated a characteristic that respiration between the case 11A and the outer air caused by the difference between the respective temperatures of the inside and outside of the case 11A can freely be performed not by way of the narrow space in the connecter portion but through the intermediary of the water-repellent filter 55A and that respiration of the fully-sealed space of the connecter portion can also be performed through the space in the case. Moreover, there is demonstrated a characteristic that when the mating connector 12A is inserted and extracted, air resistance can be suppressed from producing insertion-extraction resistance and that when the waterproof control apparatus 10A is not equipped with the mating connector 12A, dust can be prevented from freely intruding into the waterproof control apparatus 10A through the opening surface of the connector. Embodiment 2, described later, demonstrates the same characteristic.

Related to claim 9 of the present invention, the opening end of the respiratory ventilation hole 56A has the ring-shaped protruding surface 56*x* that surrounds the respiratory ventilation hole 56A; alternatively, the respiratory ventilation hole 56A is exposed at the plateau plain portion 56*y* that is higher than the peripheral portion thereof. Therefore, there is demonstrated a characteristic that when in the case where a ventilation test is applied to the water-repellent filter 55A, an elastic member is provided on the contact surface of a jig for sealing or opening the opening end of the respiratory ventilation hole 56A, watertight sealing can readily be implemented. Embodiment 2, described later, demonstrates the same characteristic.

Embodiment 2

Next, a waterproof control apparatus according to Embodiment 2 of the present invention will be explained.

(1) Detailed Description of Configuration, Action, and Operation

Each of FIG. 7 through FIGS. 10A and 10B is a view for explaining a waterproof control apparatus according to Embodiment 2 of the present invention; FIG. 7 is an external view; FIG. 8 is a front view of a connector connection portion; FIG. 9 is a detailed cross-sectional view of a connector housing; Each of FIGS. 10A and 10B illustrates an end view of a folded ventilation path. The difference between Embodiments 1 and 2 will mainly be explained in detail. Embodiment 2 differs from Embodiment 1 in that the outer ring-shaped circumferential wall of the connector housing is divided into a first ring-shaped circumferential wall and a second ring-shaped circumferential wall and in that a first group of first connection terminals and a second group of first connection terminals are mounted in and held by the diaphragm.

In FIG. 7, which is an external view of a waterproof control apparatus 10B, a case 11B is configured with a cover 30B formed of resin or sheet metal and a base 20B, formed of an aluminum die-cast or sheet metal, that has mounting feet at four corners thereof. The case 11B watertightly contains the circuit board 40 on which a connector housing 50B, described later in FIG. 9, is mounted; part of the connector housing 50B is exposed from the case 11B.

The exposed portions of the connector housing 50B are inserted into a mating connector 12B, which is configured with a first mating connector 12a and a second mating connector 12b into which the mating connector 12B is divided; the first mating connector 12a and the second mating connector 12b are connected with external apparatuses through the intermediaries of the first wire harness 60a and the second wire harness 60b, respectively, that are included in the wire harness 60B. The connector housing 50B formed of resin has a configuration obtained by replacing "A" in each of the reference characters in FIG. 2 by "B", and is provided with an inner ring-shaped circumferential wall 53B and an outer ring-shaped circumferential wall 54B that are provided on the left side and the right side, respectively, of the diaphragm 51B; the mating connector 12B is mounted on the outer ring-shaped circumferential wall 54B at a side, of the case 11B, that is exposed from the case 11B.

The three outer circumferential sides of the inner ring-shaped circumferential wall 53B abut on the opening surface of the covert 30B, through the intermediary of an unillustrated waterproof sealing material; one remaining outer circumferential side thereof abuts on one side of the base 20B through the intermediary of an unillustrated waterproof sealing material. A plurality of first connection terminals 52B is fixed in the diaphragm 51B; one end of the first connection terminal 52B is bent approximately at a right angle and is connected through soldering with the circuit board 40, described later in FIG. 9; the other end thereof makes conductive contact with the second connection terminal 14 provided in the mating connector 12B.

The narrow hole 59 is provided in the diaphragm 51B and communicates the inner space of the case 11B to the fully-sealed space in the connector. As is the case with Embodiment 1, in the mating connector 12B, a ring-shaped space is formed of the inner body portion 12X into which a plurality of second connection terminals 14 is inserted and the outer circumferential wall 12y that encloses the inner body portion 12X; the outer ring-shaped circumferential wall 54B of the connector housing 50B is inserted into the ring-shaped space. An unillustrated waterproof mechanism is provided at the position where the mating connector 12B and the wire harness 60B are taken in; the gap between the mating connector 12B and the connector housing 50B is waterproofed by waterproof packing 15 disposed between the inner circumferential surface of the outer ring-shaped circumferential wall 54B and the outer circumference of the inner body portion 12X.

In FIG. 8, which is an elevation view of the connector portion, the first and second groups of first connection terminals 52a and 52b included in the first connection terminals 52B are mounted in the diaphragm 51B, and the narrow holes 59, described above in FIG. 2 of Embodiment 1, are provided in the diaphragm 51B. The protrusion portion 54c is provided in the sidewall of, for example, the first ring-shaped circumferential wall 54a; the first ring-shaped circumferential wall 54a and the second ring-shaped circumferential wall 54b are included in the outer ring-shaped circumferential wall 54B. In the protrusion portion 54c, a respiratory ventilation hole 56B including the first and second ventilation holes 56a and 56b are opened and exposed; the recess portion 12c, which fits with the protrusion portion 54c, is provided in one of the outer circumferential walls 12y of the mating connector 12B, which fit with the outer circumference of the outer ring-shaped circumferential wall 54B. The folded ventilation path 57 is situated between the outer surface of the protrusion portion 54c and the inner surface of the recess portion 12c; the folded ventilation path 57 and the respiratory ventilation hole 56B communicate with each other. A fitting gap is formed between the inner wall of the outer circumferential wall 12y of the mating connector 12B and the outer wall of the outer ring-shaped circumferential wall 54B; the fitting gap also forms a folded ventilation surface, which is part of the folded ventilation path 57.

In FIG. 9, which is a detailed cross-sectional view of the connector housing 50B, the connector housing 50B is provided with the inner ring-shaped circumferential wall 53B and the outer ring-shaped circumferential wall 54B that flank the diaphragm 51B; the outer ring-shaped circumferential wall 54B is divided into the first and second ring-shaped circumferential walls 54a and 54b. The plurality of right-angle first connection terminals 52B mounted in the diaphragm 51B is soldered in one side of the circuit board 40; the first connection terminals 52B are grouped into the first and second groups of first connection terminals 52a and 52b.

A water-repellent filter 55B that has an inner surface portion 55a and an outer surface portion 55b and is formed of a flat porous material in the shape of, for example, a circle, a rectangle, or an ellipse is fixed to the inner wall of the diaphragm 51B. The inner surface portion 55a of the water-repellent filter 55B is fully opened to the inner space of the case 11B; the outer surface portion 55b is fully opened, except for the contour outer circumference thereof, to the respiratory ventilation hole 56B including the first and second ventilation holes 56a and 56b provided in the diaphragm 51B. Each of the first and second ventilation holes 56a and 56b has a throttle hole portion 56d provided in the inner portion thereof; the throttle hole portion 56d communicates with the outer surface portion 55b of the water-repellent filter 55B.

In FIGS. 10A and 10B, each of which is a detailed explanatory view of the folded ventilation path, FIG. 10B illustrates the case where the first mating connector 12a has been fit with the first ring-shaped circumferential wall 54a in FIG. 10A. In FIG. 10A, the protrusion portion 54c having the first and second ventilation holes 56a and 56b is provided in the side surface of the first ring-shaped circumferential wall 54a protrusively provided in the external wall surface of the diaphragm 51B of the connector housing 50B. As illustrated by a dotted line, the water-repellent filter 55B is welded and fixed, at the outer circumference thereof, to the inner wall surface of the diaphragm 51B; the outer surface portion 55b (refer to FIG. 9) of the water-repellent filter 55B communicates with the first and second ventilation holes 56a and 56b through the throttle hole portion 56d.

In FIG. 10B, the first mating connector 12a that fits with the first ring-shaped circumferential wall 54a is provided with the recess portion 12c that fits with the protrusion portion 54c provided in the first ring-shaped circumferential wall 54a; FIG. 10B illustrates the outer wall portion of the recess portion 12c. The inner bottom surface of the recess portion 12c faces, with a gap, the opening endfaces of the first and second ventilation holes 56a and 56b in the protrusion portion 54c; this gap communicates the first and second ventilation holes 56a and 56b with the folded ventilation path 57.

In FIG. 7, as a member corresponding to the water-shielding wall 58 illustrated in FIG. 1, the second ring-shaped circumferential wall 54b is disposed; thus, the positions of the ventilation opening portion for various mounting angles are the same as those in FIG. 6 of Embodiment 1. Therefore, the mounting direction of the waterproof control apparatus 10B and whether or not water is poured to the water-repellent filter 55B are the same as those that has been explained in FIG. 6. When a ventilation test on the water-repellent filter 55B is performed, an unillustrated pressurizer or depressurizer is connected inside the outer ring-shaped circumferential wall 54B of the connector housing 50B, without connecting the mating connector 12B, so that the inside of the case 11B is pressurized or depressurized through the narrow hole 59; then, the ventilation amount is measured under the condition that the opening ends of the first and second ventilation holes 56a and 56b are closed or opened with a testing jig.

(2) Gist and Feature of Embodiment 2

As is clear from the foregoing explanation, in the waterproof control apparatus 10B according to Embodiment 2, the case 11B configured with the cover 30B and the base 20B having a mounting face watertightly contains the circuit board 40; there are provided the connector housing 50B that is a resin-molded member and that is mounted at one side of the circuit board 40 and then is exposed from the side opening portion of the cover 30B and the plurality of first connection terminals 52B mounted in the diaphragm 51B of the connector housing 50B; one terminal of the first connection terminal 52B is connected with a circuit strip conductor on the circuit board 40, and the other terminal thereof abuts on and is connected with the second connection terminal 14 provided in the mating connector 12B so as to be connected with the wire harness 60B provided at the outside of the case 11B.

The connector housing 50B is provided at the outer side of the diaphragm 51B and includes the outer ring-shaped circumferential wall 54B with which the mating connector 12B fits; the water-repellent filter 55B, which is a flat porous material including a plurality of fine pores for preventing water drops from intruding into the case 11B and for letting the air freely pass therethrough, is watertightly fixed to the inner surface of the diaphragm 51B.

The water-repellent filter 55B includes the inner surface portion 55a that communicates with the inner space of the case 11B and the outer surface portion 55b that communicates with the respiratory ventilation hole 56B for introducing the outer air. The respiratory ventilation hole 56B penetrates the inside of the protrusion portion 54c provided in the external wall surface of the outer ring-shaped circumferential wall 54B; the waterproof packing 15 for preventing water from intruding into the closed space including the conductive contact portion between the first connection terminal 52B and the second connection terminal 14 is provided between the end surface portion of the outer ring-shaped circumferential wall 54B and the mating connector 12B that fits with the outer ring-shaped circumferential wall 54B. At the external position of the foregoing closed space, the respiratory ventilation hole 56B communicates with the folded ventilation surface that is opened to the air through part of or the whole of the inner surface of the circumferential wall of the mating connector 12B.

Relating to claim 4 of the present invention, the outer ring-shaped circumferential wall 54B is divided into the first and second ring-shaped circumferential walls 54a and 54b, and the mating connector 12B is also divided into the first and second mating connectors 12a and 12b; the water-repellent filter 55B is watertightly fixed to the inner surface of the diaphragm 51B situated at the intermediate position between the first and second ring-shaped circumferential walls 54a and 54b.

As described above, in the waterproof control apparatus 10B according to Embodiment 2, the connector housing 50B has the first and second ring-shaped circumferential walls 54a and 54b that fit with the first and second mating connectors 12a and 12b, respectively; the water-repellent filter 55B is watertightly fixed to the diaphragm 51B situated at the intermediate position between the first and second ring-shaped circumferential walls 54a and 54b. Accordingly, there is demonstrated a characteristic that because situated between the first and second mating connectors 12a and 12b that are placed at the left and right sides, respectively, thereof, the respiratory ventilation hole 56B is not liable to become subject to direct water pouring.

Heretofore, the respective waterproof control apparatuses according to Embodiments 1 and 2 of the present invention have been explained with reference to the drawings; however, in the scope of the present invention, the embodiments thereof can freely be combined with one another and can appropriately be modified or omitted.

What is claimed is:

1. A waterproof control apparatus comprising:
    a circuit board that is watertightly contained in a case configured with a cover and a base having a mounting face;
    a connector housing that is formed of a resin-molded material, mounted in the circuit board, and exposed from a side opening portion of the cover; and
    a plurality of first connection terminals mounted in a diaphragm of the connector housing,
    wherein one terminal of the first connection terminal is connected with a circuit strip conductor on the circuit board, and the other terminal thereof abuts on and is connected with the second connection terminal provided in a mating connector so as to be connected with a wire harness provided at an outside of the case,
    wherein the connector housing includes
        an outer ring-shaped circumferential wall that is provided at an outer side of the diaphragm and with which the mating connector fits, and
        a water-repellent filter that is formed of a porous material including a plurality of fine pores for preventing water drops from intruding into the case and for letting air freely pass therethrough and that is watertightly fixed to an inner surface of the diaphragm,
    wherein the water-repellent filter includes an inner surface portion that communicates with an inner space of the case and an outer surface portion that communicates with a respiratory ventilation hole for introducing outer air,
    wherein the respiratory ventilation hole penetrates an inside of a protrusion portion provided in an external wall surface of the outer ring-shaped circumferential wall, and a waterproof packing for preventing water from intruding into a closed space including a conductive contact portion between the first connection terminal and the second connection terminal, is provided between the end surface portion of the outer ring-shaped circumferential wall and the mating connector that fits with the outer ring-shaped circumferential wall, and
    wherein at an external position of said closed space, the respiratory ventilation hole communicates with a folded ventilation surface that is opened to air outside the waterproof control apparatus through part of or the whole of the inner surface of the circumferential wall of the mating connector.

2. The waterproof control apparatus according to claim 1, wherein a recess portion that fits with the protrusion portion is provided in an inner wall surface of the mating connector;

a folded ventilation path that communicates with the respiratory ventilation hole is formed between an outer wall of the protrusion portion and an inner wall of the recess portion; at a position that is close to the diaphragm, one end of the folded ventilation path is opened to the air outside the waterproof control apparatus.

3. The waterproof control apparatus according to claim 1, wherein a water-shielding wall is integrally provided at a side position of the outer ring-shaped circumferential wall, and the water-shielding wall is provided at a position of a to-the-air opening that is close to the respiratory ventilation hole.

4. The waterproof control apparatus according to claim 1, wherein the outer ring-shaped circumferential wall is divided into first and second ring-shaped circumferential walls; the mating connector is also divided into first and second mating connectors; the water-repellent filter is water-tightly fixed to the inner surface of the diaphragm situated at the intermediate position between the first and second ring-shaped circumferential walls.

5. The waterproof control apparatus according to claim 1, wherein the two or more first connection terminals are arranged at positions in two or more upper/lower stairs in a direction that is perpendicular to a board surface of the circuit board; the respiratory ventilation hole includes a first ventilation hole and a second ventilation hole that are arranged in a vertical direction or in a horizontal direction that is perpendicular to the board surface of the circuit board; one end of each of the first and second ventilation holes communicates with the outer surface portion of the water-repellent filter, and another end of each of the first and second ventilation holes is opened to the air outside the waterproof control apparatus through the inner wall surface of the mating connector or the folded ventilation path that communicates with the respiratory ventilation hole.

6. The waterproof control apparatus according to claim 1, wherein a throttle hole portion is provided so that the hole diameter of the respiratory ventilation hole becomes smaller at an approaching position that communicates with the outer surface portion of the water-repellent filter.

7. The waterproof control apparatus according to claim 6, wherein the throttle hole portion is unevenly distributed with respect to the center position of the respiratory ventilation hole; when a mounting inclination angle is known, the contour of a nesting die for producing the throttle hole portion is modified so that the throttle hole portion is unevenly distributed in such a way that a poured-water puddle becomes wider.

8. The waterproof control apparatus according to claim 1, wherein a narrow hole that communicates with the inner space of the case is provided in an inner surface of the outer ring-shaped circumferential wall.

9. The waterproof control apparatus according to claim 8, wherein an opening end of the respiratory ventilation hole has a ring-shaped protruding surface that surrounds the respiratory ventilation hole; alternatively, the respiratory ventilation hole is exposed at a plateau plain portion that is higher than the peripheral portion thereof.

* * * * *